United States Patent [19]

Noguchi et al.

[11] Patent Number: 4,901,123
[45] Date of Patent: Feb. 13, 1990

[54] SUPERLUMINESCENT DIODE

[75] Inventors: Yoshio Noguchi; Haruo Nagai, both of Isehara; Kazumasa Takada, Katsuta; Juichi Noda, Mito, all of Japan

[73] Assignee: Nippon Telegraph and Telephone Corporation, Tokyo, Japan

[21] Appl. No.: 277,088

[22] Filed: Nov. 28, 1988

[30] Foreign Application Priority Data

Dec. 2, 1987 [JP] Japan .................. 62-303296
Aug. 19, 1988 [JP] Japan .................. 63-206024
Oct. 3, 1988 [JP] Japan .................. 63-249627

[51] Int. Cl.$^4$ ............................. H01L 33/00
[52] U.S. Cl. .................. 357/17; 350/96.11; 372/45; 372/108
[58] Field of Search ............ 357/17; 350/96.11, 96.12; 372/45, 46, 50, 108

[56] References Cited

U.S. PATENT DOCUMENTS 4,634,928 1/1987 Figueroa et al. ............ 357/17
4,718,070 1/1988 Liau et al. .................. 372/50
4,730,331 3/1988 Burnham et al. ............ 372/50
4,799,229 1/1989 Miyazawa et al. .......... 372/50

OTHER PUBLICATIONS

SPIE vol. 719, Fiber Optic Gyros: 10th Anniversary Conference 1986 pp. 208–215.
OQE87-39, pp. 71–75, 1987 by Tanioka et al.
OFS'88 FDD 2-1, pp. 451–454 (1988), Jan.) N. S. K. Kwong et al.

Primary Examiner—James W. Davie
Attorney, Agent, or Firm—Townsend & Townsend

[57] ABSTRACT

According to this invention, a superluminescent diode includes a current injection portion having a current injection electrode formed adjacent to a first end face, a light-absorption portion contiguous with the current injection portion; and a waveguide continuously formed to extend from the current injection portion to the light-absorption portion. The waveguide is constituted by an active layer and a member which completely buries the active layer, has a bandgap larger than that of the active layer, and is formed of a material having a small refractive index. The waveguide of the current injection portion is linearly formed to be perpendicular to the first end face. The waveguide of the light-absorption portion has an end portion for guiding reflected light in a direction different from a propagation direction of light propagating through the waveguide.

8 Claims, 8 Drawing Sheets

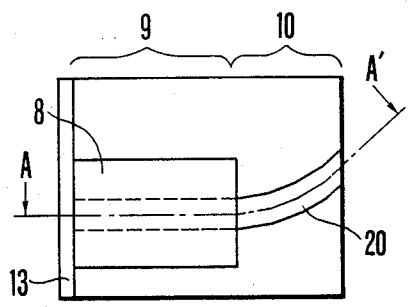 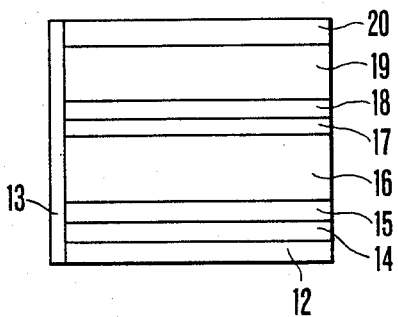
F I G. 9 (a)   F I G. 9 (b)
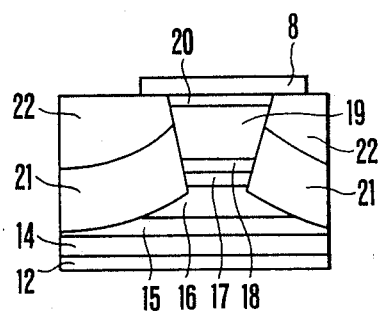
F I G. 9 (c)
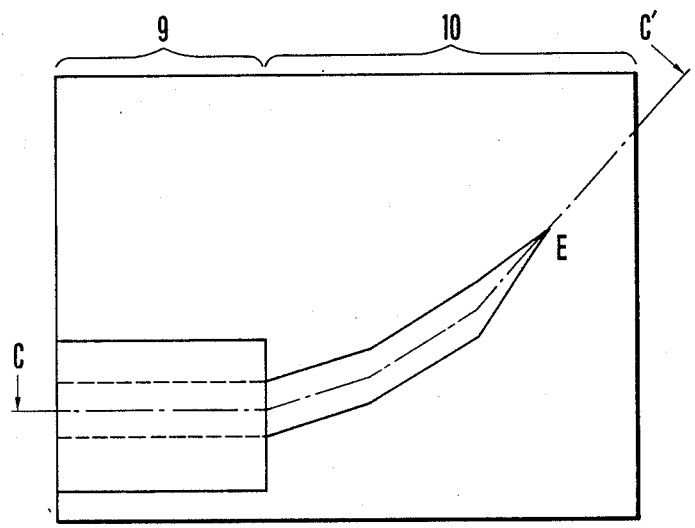
F I G. 12

SUPERLUMINESCENT DIODE

BACKGROUND OF THE INVENTION

The present invention relates to a superluminescent diode which is effectively used as a light source for an optical fiber gyro, optical disk, or the like, and can radiate coherent light with high intensity and small radiation angle.

In a superluminescent diode for deriving a large coherent light output from an end face of an active layer, it is important to suppress laser oscillation in a Fabry-Perot (FP) mode. In order to suppress this oscillation, a countermeasure for reducing a light emission factor at the end face of the active layer such as end face AR (anti-reflecting) coat, formation of a non-excitation region, oblique etching of an end face, end face burying, or the like has been taken. However, it is difficult to sufficiently suppress FP mode oscillation using only the AR coat. When FP mode oscillation is suppressed by obliquely etching the end face or burying the end face, or a combined means, a refractive index at the end face becomes unexpectedly large, and a reflectivity reaches about 1% as compared to the case of cleavage. In particular, when the thickness of the active layer is increased, this influence becomes noticeable, and the reflectivity is also increased. Thus, FP mode oscillation is difficult to suppress using only the above-mentioned means.

FIGS. 1a to 1c show a buried superluminescent diode in which a non-excitation region 10 combined with an end face burying region 11 is formed. Reference numeral 9 denotes a current injection region; 10, a non-excitation region; and 11, an end face burying region. Reference numeral 13 denotes an AR coat formed on a light output surface. Since the width of an active layer 3 of the non-excitation region 10 is the same as that of the current injection region 9, light is effectively guided. Therefore, carriers are excited in the non-excitation region 10, and an absorption coefficient is reduced thereby. Therefore, in order to suppress FP mode oscillation, the length of the non-excitation region 10 must be several times longer substantially than that of the current injection region 9, i.e., must be elongated.

FIG. 2 is a plan view of a buried superluminescent diode in which a non-excitation region which can solve the drawback of the diode shown in FIGS. 1a to 1c to some extent is formed. The feature of this diode is that the axial orientation of a cleavage end face and those of the active layers of the current injection region 9 and the non-excitation region 10 are offset from a vertical direction, and both the end faces do not easily serve as a resonator in laser oscillation. A suppression effect of FP mode oscillation is enhanced as the offset in the axial orientation of the active layer is larger at both the end faces and the reflected light at the end faces goes outside the waveguide. However, since a light output direction is not perpendicular to the end face, it is difficult to obtain a high coupling efficiency in consideration of coupling with an optical fiber.

In the conventional superluminescent diode with the above-mentioned structure, when a light guide layer is formed adjacent to the active layer in order to improve a light extraction efficiency, as shown in FIGS. 1a to 1c, an effective absorption coefficient of the non-excitation injection region is decreased, and FP mode laser oscillation tends to occur.

SUMMARY OF THE INVENTION

It is therefore a principal object of the present invention to provide a high luminescent diode which can sufficiently suppress FP mode oscillation even if an element length is small, and can serve a highly coupling efficiency with an optical fiber.

It is another object of the present invention to provide a measurement apparatus which can accurately measure the positions of obstacle points scattered along a light waveguide and the amplitude of scattered light.

In order to achieve the principal object, there is provided a superluminescent diode comprising: a current injection portion having a current injection electrode formed adjacent to a first end face; a light-absorption portion contiguous with the current injection portion; and a waveguide continuously formed to extend from the current injection portion to the light-absorption portion, wherein the waveguide is constituted by an active layer and a member which completely buries the active layer, has a bandgap larger than that of the active layer, and is formed of a material having a small refractive index, the waveguide of the current injection portion is linearly formed to be perpendicular to the first end face, and the waveguide of the light-absorption portion has an end portion for guiding reflected light in a direction different from a propagation direction of light propagating through the waveguide.

In order to achieve another object, according to the present invention, there is provided a measurement apparatus comprising: a light source comprising a superluminescent diode which comprises a current injection portion having a current injection electrode formed adjacent to a first end face, a light-absorption portion contiguous with the current injection portion, and a waveguide continuously formed to extend from the current injection portion to the light-absorption portion, the waveguide being constituted by an active layer and a member which completely buries the active layer, has a bandgap larger than that of the active layer, and is formed of a material having a small refractive index, the waveguide of the current injection portion being linearly formed to be perpendicular to the first end face, and the waveguide of the light-absorption portion having an end portion for guiding reflected light in a direction different from a propagation direction of light propagating through the waveguide; means for receiving light from the light source and causing backward scattered light scattered backward by an obstacle point present in the waveguide to be measured and output from the waveguide to be interfered with reference light corresponding to some light components from the light source; and means for obtaining a position of the obstacle point from the interfered components of the backward scattered light and the reference light.

BRIEF DESCRIPTION OF THE DRAWINGS

FIGS. 1a to 1c show a structure of conventional superluminescent diodes in which FIG. 1a is a plan view, FIG. 1b is a sectional view along a stripe direction, and FIG. 1c is a cross-sectional view;

FIGS. 5a to 5c show an embodiment of the present invention, in which FIG. 5a is a plan view, FIG. 5b is a sectional view taken along a line A—A' in FIG. 5a, and FIG. 5c is a sectional view of a light-emitting portion taken along a line B—B' in FIG. 5a;

FIGS. 9a to 9c show another embodiment of the present invention, in which FIG. 9a is a plan view, FIG. 9b is a sectional view of a light guide layer, and FIG. 9c is a sectional view of a light-emitting portion;

FIGS. 10a and 10b show still another embodiment of the present invention, in which FIG. 10a is a plan view and FIG. 10b is a side view of FIG. 10a;

FIGS. 11a and 11b show still another embodiment of the present invention, in which FIG. 11a is a plan view an FIG. 11b is a side view of FIG. 11a;

FIGS. 12 and 13 are plan views showing still another embodiment of the present invention;

DESCRIPTION OF THE PREFERRED EMBODIMENTS

The present invention will now be described in detail with reference to the accompanying drawings.

Figure 1A:
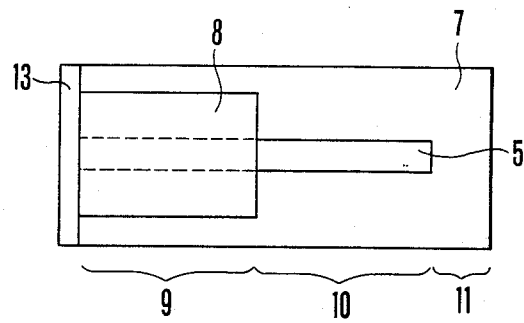
Figure 1B:
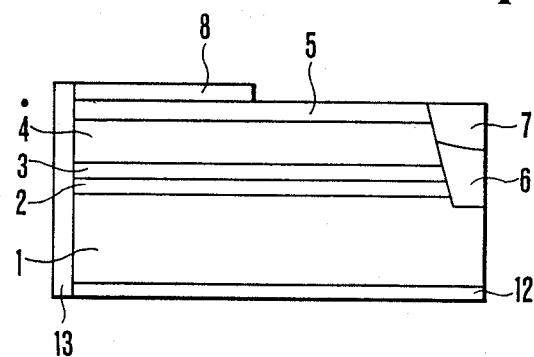
Figure 1C:
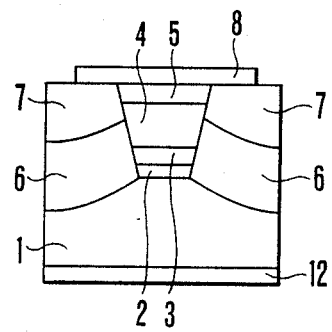
Figure 2:
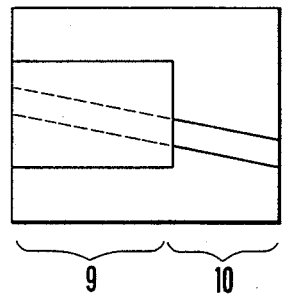
FIG. 2 is a plan view of another conventional diode.
Figure 3:
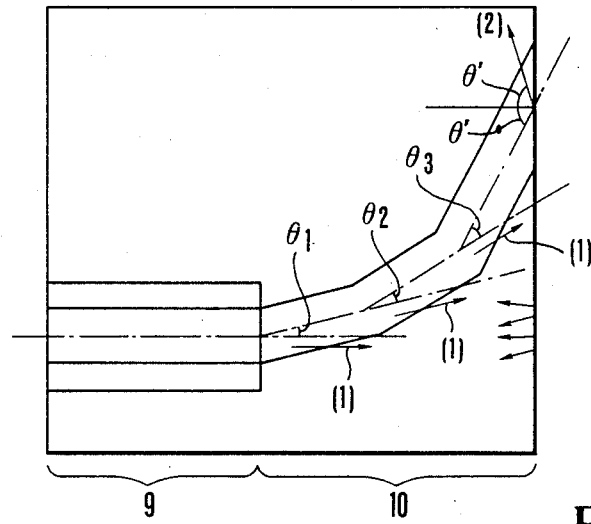
FIGS. 3 and 4 are plan views for explaining the principle of the present invention.

FIG. 3 is a plan view showing the structure and principle of a superluminescent diode according to the present invention. The diode as a whole has a box shape. An active layer of a current injection region 9 is linearly formed to be perpendicular to a cleavage end face or an end face formed by polishing. A non-excitation region or light-absorption region 10 is formed by repeating small axial offset angles $\theta_1, \theta_2, \theta_3, \ldots, \theta_n$ so that almost all light emitted from the current injection region 9 can be guided with a small loss in a direction different from an extending axis of the current injection region.

In the structure shown in FIG. 3, light emitted from the current injection region 9 and propagating toward the non-excitation region 10 is classified into components (1) which leak due to bending of the waveguide at the non-excitation region 10, components (2) guided to the end face and reflected thereby, and components (not shown) absorbed during guidance.

The amount of leakage of the components (1) is determined by a bending angle of the waveguide and a difference in refractive index of the active layer and a buried layer in the guide structure. As the bending angle is smaller and the refractive index difference is larger, the amount of leakage of the components (1) is small. Since the leaking light components are diffused in the buried layer and are reflected by the end face, the amount of light components which are returned to the current injection layer 9 and subjected to coupling again is small.

As the axial offset angles $\theta_1$ to $\theta_n$ are smaller, almost all the light can be guided to escape.

The light components (2) guided to the end face are reflected by the end face, and can be escaped in a direction where the escaped light components are not coupled to the current injection region 9 at all.

In this case, in group III-V elements, if $\theta' > 5$, reflected light is radiated outside the waveguide.

When an AR film is formed on a light-extraction end face, an effect of suppressing FP mode oscillation can be enhanced.

Figure 4:
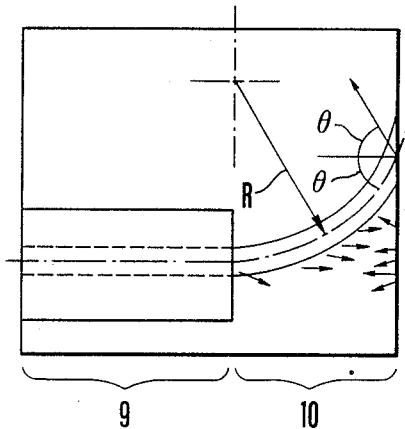

In FIG. 3, although the waveguide of the non-excitation portion or light-absorption portion is part of a polygon, the waveguide may be part of a circle, ellipse, or a curve of a higher order, e.g., the second or third order, as a matter of course. FIG. 4 is a plan view showing a case wherein the waveguide is part of a circle. In FIG. 4, a bent waveguide reaches a surface opposite to the output end face. If the bent waveguide reaches a side surface, the same effect as described above can be obtained.

The effect of the present invention will be described hereinafter with reference to illustrated embodiments.

(Embodiment 1)

Figure 5A:
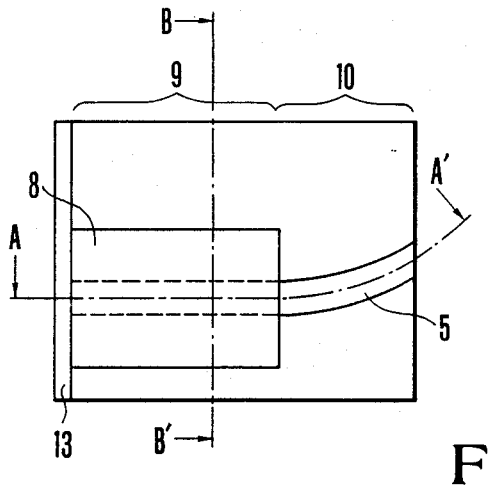
Figure 5B:
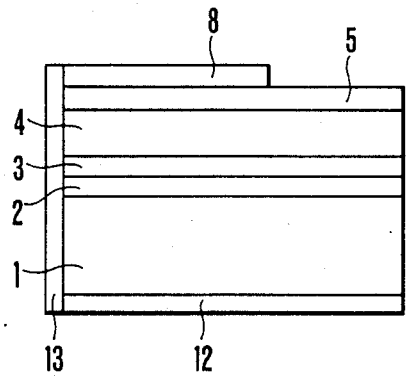
Figure 5C:
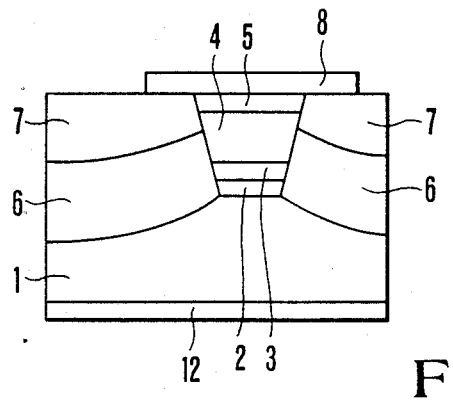

FIGS. 5a to 5c show an embodiment of the present invention using an InP/GaInAsP material. In order to obtain a superluminescent diode of the present invention, in a first growth, an n-type GaInAsP light guide layer ($\lambda$: 1.1 $\mu$m composition) 2, a non-doped GaInAsP active layer ($\lambda$: 1.3 $\mu$m composition) 3, a p-type InP cladding layer 4, and a p-type GaInAsP electrode layer ($\lambda$: 1.1 $\mu$m composition) 5 were grown on an n-type InP substrate 1 by LPE (Liquid Phase epitaxy) and VPE (Vapor Phase Epitaxy; e.g., MO-CVD (Metal Oxide-Chemical Vapor Deposition)) or MBE (Molecular Beam Epitaxy). Then, an $SiO_2$ or SiN thin film was formed on the entire surface of the p-type GaInAsP electrode layer 5 by RF (Radio Frequency) bipolar sputterig or CVD. In order to bury an active layer, the thin film was patterned by photoetching as follows. A current injection region 9 was linearly formed in a stripe shape along a <110> direction to have a width of 4 to 5 $\mu$m and a length of 400 $\mu$m, and a non-excitation region or light-absorption region 10 was formed to have the same width as the stripe width of the current injection region so that the length of the non-excitation region 10 became 200 $\mu$m for a radius R=0.8 mm. Thereafter, the layers 5, 4, 3, and 2 were etched by a brome methanol 4% solution using the $SiO_2$ or SiN stripe thin layer as a mask until the substrate 1 was exposed, thereby forming an inverted mesa multilayered structure. In a second growth, a p-type InP layer 6 and an n-type InP layer 7 were buried by LPE to regulate a current in a portion removed by etching. An Au-Zn layer was deposited on the upper surface of the resultant wafer, and a p-type ohmic electrode 8 was formed on only the current injection region 9 by photoetching. After the substrate 1 was polished to have a total thickness of about 80 $\mu$m, an Au-Ge-Ni layer was deposited on the substrate to form an n-type ohmic electrode 12 on the entire surface. The structures of the layers of the resultant element in the state of FIG. 5 are as follows, and the respective crystalline layers match with an InP lattice constant:

1: Sn-doped n-type InP substrate; thickness=80 $\mu$m, carrier density=$8 \times 10^{18}$ cm$^{-3}$, EPD=$5 \times 10^4$ cm$^{-2}$ 2: Sn-doped n-type GaInAsP light guide layer; thickness=0.2 $\mu$m, carrier density=$5 \times 10^{17}$ cm$^{-3}$ 3: non-doped n-type GaInAsP active layer; thickness=0.2 to 0.3 $\mu$m 4: Zn-doped p-type InP crystalline layer; thickness=1.5 $\mu$m, carrier density=$5 \times 10^{17}$ cm$^{-3}$ 5: Zn-doped p-type GaInAsP electrode layer; thickness = 0.7 μm, carrier density = $5 \times 10^{18}$ cm$^{-3}$ 6: Zn-doped p-type InP current regulating layer; thickness = 1.5 μm, carrier density = $1 \times 10^{17}$ cm$^{-3}$ 7: Sn-doped n-type InP current regulating layer; thickness = 1.5 μm, carrier density = $1 \times 10^{17}$ cm$^{-3}$ An nti-reflecting coat 13 comprising a multilayered film of $SiO_2$ and $TiO_2$ was formed on the light output end face so as to obtain a reflectivity of 0.5% or less with respect to light having a wavelength of 1.3 μm. The element was divided into uniform pellets having a total length of 600 μm and a width of 400 μm, each pellet was mounted on a heat sink by AuSn soldering, and a current and light output characteristics with respect to light having a wavelength of 1.3 μm were measured. As a result, a light output was increased without causing oscillation along with current injection in a 25° C. continuous operation, and an incoherent light output of 12 mW could be obtained at 200 mA. As compared to a conventional element, since injected light was guided by the non-excitation region 10 in a direction different from an extending axis of the current injection portion, return of light from the end face to the light-emitting portion could be effectively prevented by utilizing an axial offset at the end face. Therefore, the total element length could be shortened to ¼ or less of that of the conventional element, and FP mode oscillation could be sufficiently suppressed.

The characteristics of the element will be described in more detail below.

Figure 6:
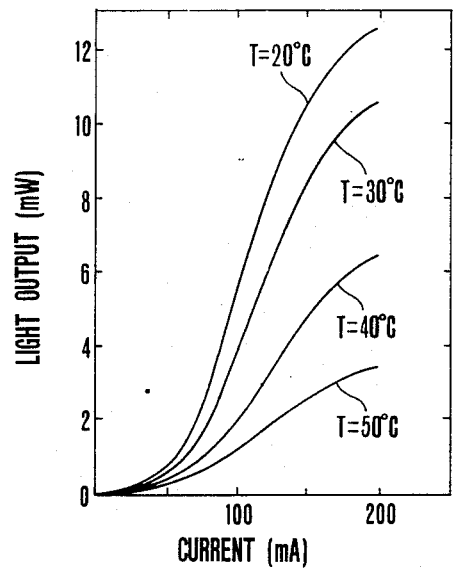
FIG. 6 is a graph showing a temperature dependency of a light output of a superluminescent diode.

FIG. 6 shows a temperature dependency of the superluminescent diode of the structure shown in FIG. 5. A light output of 3 mW is available at a high temperature of 50° C. and a current of 200 mA.

Figure 7:
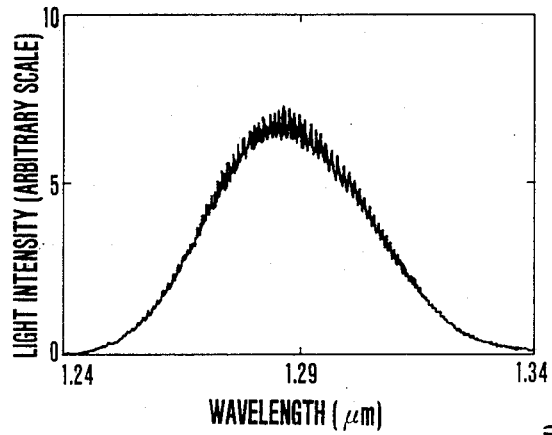
FIG. 7 is a graph showing a spectrum of the superluminescent diode.

FIG. 7 shows a spectrum of the superluminescent diode shown in FIG. 5. As can be seen from FIG. 7, FP mode oscillation can be sufficiently suppressed at a high output of 10 mW. Upon measurement using an interferometer, a coherence length is as short as about 30 μm at an output of 10 mW. When a far field pattern determining a radiation angle of light was measured, it was as narrow as 52° in a direction perpendicular to the active layer and 48° in a direction parallel to the active layer. Thus, sharp directivity could be obtained.

As a result of these excellent characteristics, a high light input into a single mode fiber can be achieved.

Figure 8:
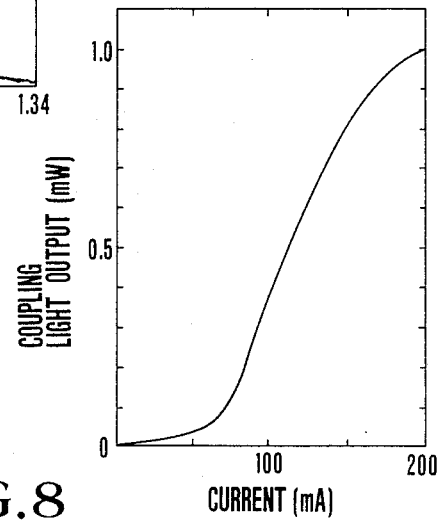
FIG. 8 is a graph showing light coupled with a single mode fiber.

FIG. 8 shows results of a light input test by lens coupling to a single mode fiber having a core diameter of 10 μm. A high light input of 800 μW could be obtained at 25° C. and 150 mA.

In a coupling test using a spherical end fiber having a high coupling efficiency, a result of 1.8 mW could be obtained at 200 mA.

Note that this embodiment employs the n-type InP substrate. However, the same effect as described above can be obtained if a p-type InP substrate is used. In this case, in the structure, n- and p-type regions are replaced. In this embodiment, a BH (Buried Hetero) type or buried type superluminescent diode has been exemplified. However, the same effect as described above can be obtained if the present invention is applied to a DCPBH (Double Channel Planar Buried Heterostructure laser) or VSB (V-grooved Substrate Buried-Heterostructure laser) type diode.

In FIGS. 5a to 5c, the lenth of the electrode 8 of the current injection portion is 400 μm. However, when the electrode 8 was formed on the entire surface over the current injection portion 9 and the light-absorption portion 10, a superluminescent diode having a wide spectrum could be realized. In this case, a radius R of curvature of the bent guide must be reduced. If R = 800 μm, laser oscillation occurred. However, if R = 500 μm, the superluminescent diode could be achieved.

(Embodiment 2)

FIGS. 9a to 9c show another embodiment of the present invention using a GaAs/AlGaAs material. In order to obtain a superluminescent diode of this embodiment, various growth techniques are available as in Embodiment 1. In this embodiment, in a first growth, a 0.5-μm thick n-type GaAs buffer layer 15, a 1-μm thick n-type $Al_{0.35}Ga_{0.65}As$ cladding layer 16, a 0.5-μm thick non-doped $Al_{0.05}Ga_{0.95}As$ active layer 17, a 0.10-μm thick p-type $Al_{0.20}Ga_{0.80}As$ light guide layer 18, a 2-μm thick p-type $Al_{0.35}Ga_{0.65}As$ cladding layer 19, and a 0.5-μm thick p-type GaAs electrode layer 20 were sequentially grown on an n-type GaAs substrate 14. Then, an inverted mesa multilayered structure was formed following the same procedures as in Embodiment 1 to perform burying growth in the subsequent process. In a second growth, a p-type $Al_{0.35}Ga_{0.65}As$ layer 21 and an n-type $Al_{0.35}Ga_{0.65}As$ layer 22 were buried by LPE in a portion removed by etching so as to obtain current regulating and optical confinement effects. The structures of the respectively layers of the resultant element in FIGS. 9a to 9c are as follows, and the respectively crystalline layers match with a GaAs lattice constant:

14: Si-doped n-type GaAs substrate; thickness = 80 μm, carrier density = $5 \times 10^{18}$ cm$^{-3}$, EPD = 500 cm$^{-2}$ 15: Si-doped n-type GaAs buffer layer; carrier density = $1 \times 10^{18}$ cm$^{-3}$ 16: Si-doped n-type $Al_{0.35}Ga_{0.65}As$ cladding layer; carrier density = $5 \times 10^{17}$ cm$^{-3}$ 17: non-doped n-type $Al_{0.05}Ga_{0.95}As$ active layer 18: Zn-doped p-type $Al_{0.20}Ga_{0.80}As$ light guide layer; carrier density = $5 \times 10^{17}$ cm$^{-3}$ 19: Zn-doped p-type $Al_{0.35}Ga_{0.65}As$ cladding layer; carrier density = $5 \times 10^{17}$ cm$^{-3}$ 20: Zn-doped p-type GaAs electrode layer; carrier density = $5 \times 10^{18}$ cm$^{-3}$ 21: Zn-doped p-type $Al_{0.35}Ga_{0.65}As$ buried layer; carrier density = $1 \times 10^{17}$ cm$^{-3}$ 22: Si-doped n-type $Al_{0.35}Ga_{0.65}As$ buried layer; carrier density = $1 \times 10^{17}$ cm$^{-3}$ The sizes of the respective element portions are the same as those in Embodiment 1.

The resultant wafer was subjected to formation of a p-type ohmic electrode, substrate polishing, and formation of an n-type ohmic electrode, and thereafter was mounted on a heat sink. Current-light output characteristics and a light-emission spectrum of the wafer were measured. A light output was increased along with an increase in injected current, and a light output of 18 mW could be obtained at 150 mA. A element having an AR coat on its light extraction surface could provide a light output of twice to three times, and recorded 38 mW at 150 mA. As for the light-emission spectrum, an incoherent light output having a half-width of 200 Å could be obtained while suppressing FP mode oscillation as in Embodiment 1, and the light-emission center wavelength was 0.83 μm.

In this embodiment, the GaInAsP element having a wavelength of 1.3 μm and the GaAs/GaAlAs element having a wavelength of 0.83 μm have been exemplified. However, the present invention can be applied to incoherent light-emitting elements using other wavelength ranges and different semiconductors.

(Embodiment 3)

Figure 10A:
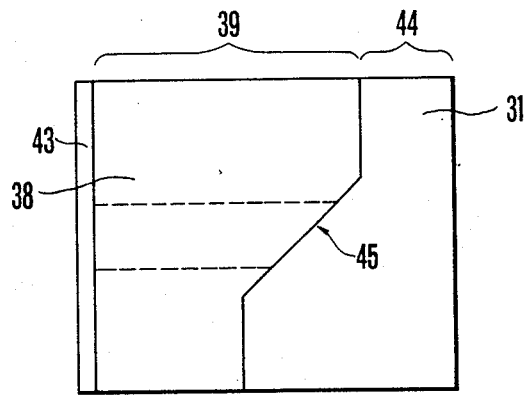
Figure 10B:
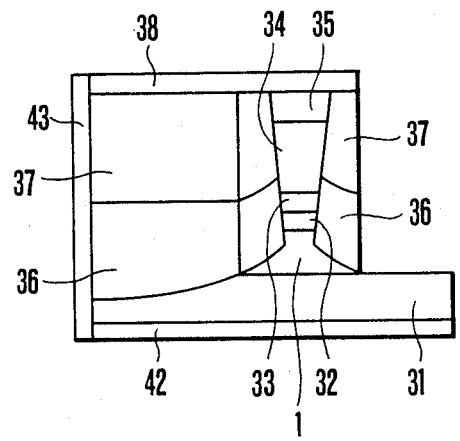

FIGS. 10a and 10b show still another embodiment of the present invention using an InP/GaInAsP material. In order to obtain a superluminescent diode of this embodiment, in a first growth, an n-type GaInAsP light guide layer (λ: 1.1 μm composition) 32, a non-doped GaInAsP active layer (λ: 1.3 μm composition) 33, a p-type InP cladding layer 34, and a p-type GaInAsP electrode layer (λ: 1.1 μm composition) 35 were grown on an n-type InP substrate 31 by LPE and VPE or MBE. An $SiO_2$ or SiN thin film was formed on the entire surface of the p-type GaInAsP electrode layer 35 by RF bipolar sputter or CVD. Thereafter, in order to bury the active layer, the thin film was linearly patterned by photoetching in a stripe shape along a <110> direction to have a width of 4 to 5 μm. Thereafter, the layers 35, 34, 33, and 32 were etched to expose the substrate 31 by a brome methanol 4% solution using the $SiO_2$ or SiN stripe thin film as a mask, thereby forming an inverted mesa multilayered structure. In a second growth, a p-type InP layer 36 and an n-type InP layer 37 were buried by LPE in a portion removed by etching to obtain a current regulating effect. An Au-Zn layer was deposited on the upper surface of the resultant wafer, and an electrode pattern on one end face was formed by photoetching to have an angle with a light-radiation direction of 20° so that a p-type ohmic electrode 38 was formed on only the current injection region 9. The substrate 31 was polished to have a total thickness of about 80 μm, and thereafter, an Au-Ge-Ni layer was deposited thereon to form an n-type ohmic electrode 42 on the entire surface. The structures of the respective layers of the resultant element in FIGS. 10a and 10b are as follows, and the respectively crystalline layers match with an InP lattice constant:

31: Sn-doped n-type InP substrate; thickness=80 μm, carrier density=$3 \times 10^{18}$ cm$^{-3}$, EPD=$5 \times 10^4$ cm$^{-2}$
32: Sn-doped n-type GaInAsP light guide layer; thickness=0.2 μm, carrier density=$5 \times 10^{17}$ cm$^{-3}$
33: non-doped n-type GaInAsP active layer; thickness=0.2 to 0.3 μm
34: Zn-doped p-type InP crystalline layer; thickness=1.5 μm, carrier density=$5 \times 10^{17}$ cm$^{-3}$
35: Zn-doped p-type GaInAsP electrode layer; thickness=0.7 μm, carrier density=$5 \times 10^{18}$ cm$^{-3}$
36: Zn-doped p-type InP current regulating ayer; thickness≃1.5 μm, carrier density=$1 \times 10^{17}$ cm$^{-3}$
37: Sn-doped n-type InP current regulating layer; thickness≃1.5 μm, carrier density=$1 \times 10^{17}$ cm$^{-3}$ Thereafter, an $SiO_2$ film was formed on the entire surface on the side of the p-type electrode, and was patterned by photoetching to be left on only the current injection region 9. The resultant structure was etched using a Br-based gas by an RIE (Reactive Ion Etching) apparatus using $SiO_2$ film pattern as a mask to etch a region 44 excluding the region 9 until the substrate was exposed, thus forming an FP mode oscillation suppression end face 45 serving as a light-absorption portion.

An anti-reflecting coat comprising a multilayered film of $SiO_2$ and $TiO_2$ was formed on the light output end face to obtain a reflectivity of 0.5% or less with respect to light having a wavelength of 1.3 μm. The resultant element was divided into uniform pellets having a total length of 500 μm and a width of 400 μm, and a 400-μm wide current injection region 9. Each pellet was monted on a heat sink by AuSn soldering, and its current and light output characteristics at a wavelength of 1.3 μm were measured. As a result, a light output was increased without causing oscillation along with current injection in a 25° C. continuous operation, and an incoherent light output of 12 mW could be obtained at 200 mA. As compared to a conventional element, return of light from the end face to the light-emitting portion could be effectively prevented, and the element length could be reduced to about ¼ or less of that of the conventional element. In addition, FP mode oscillation could be sufficiently suppressed. A light output of 1 mW could be obtained at an injection current of 175 mA upon coupling with an SLM (single mode) fiber having a core diameter of 10 μm through a lens.

Figure 11A:
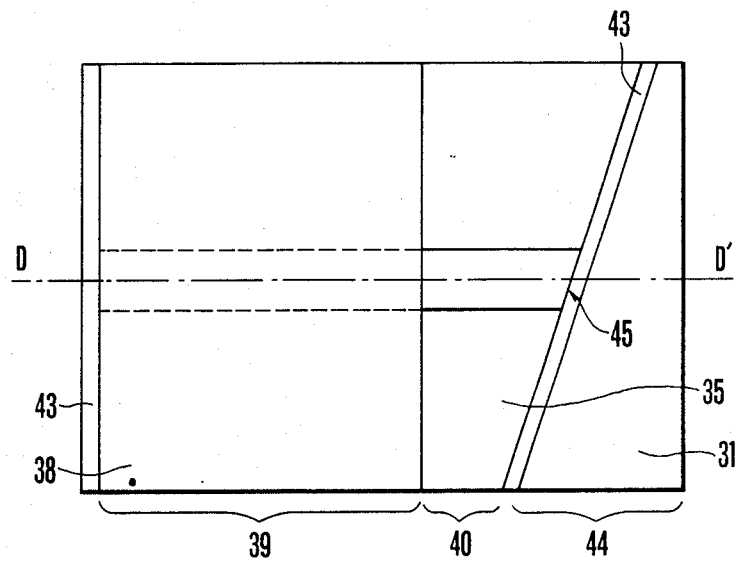
Figure 11B:
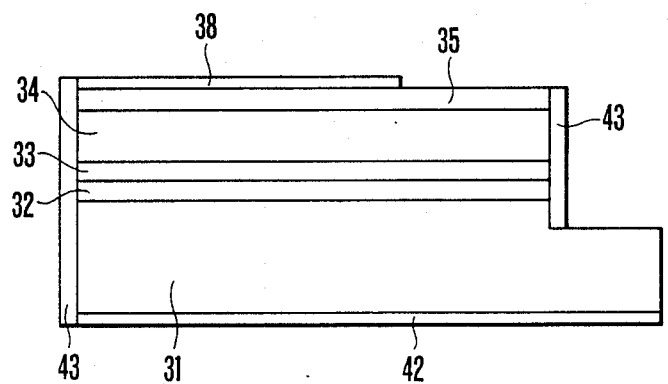

In a sample wherein a non-excitation region as shown in FIGS. 11a and 11b was formed, and an AR film was formed also on the FP mode suppression end face, incoherent light having a good spectrum free from modulation in the FP mode could be obtained.

As a buried structure, a structure wherein a mesa structure including an active portion is buried with an organic material such as polyimide or low-melting point glass is available as well as a structure wherein the mesa structure is buried with a group III-V single crystalline epitaxial layer. In these structures, since a difference in refractive index between the active portion and a buried portion is large, a loss is small even if an angle θ of the bent guide portion or the bending angle of the waveguide portion is large. Thus, light can be effectively guided to the end face by the non-excitation portion and can be reflected at a large incident angle so as not to be returned to the active portion.

As shown in FIG. 12, a structure wherein the active layer of the non-excitation portion is tapered, and the tapered end is buried in the end face is available. In FIG. 12, a leading end E of a waveguide of the light-absorption portion 10 is separated from all the end faces. With this structure, generation of reflected light can be suppressed at the end portion of the light-absorption portion as in the above-mentioned embodiments.

Figure 13:
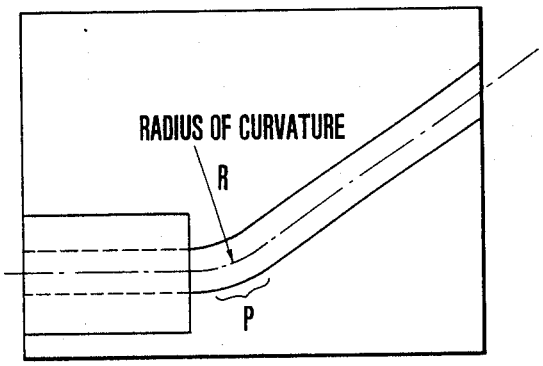

As shown in FIG. 13, most part of the waveguide of the light-absorption portion 10 is linearly formed, and a predetermined bending angle P is formed at a connecting portion with an excitation portion, e.g., the current injection portion 9 so as to offset the optical axes of the current injection portion 9 and the light-absorption portion 10. With this structure, the same effect as described above can be obtained.

As described above, according to the present invention, since a non-current injection portion for guiding light in a direction different from an extending axis of a current injection portion is formed contiguous with the linear current injection portion, return of light from the end face to a light-emitting portion can be sufficiently prevented, and hence, FP mode oscillation can be sufficiently suppressed. The suppression effect of FP mode oscillation has two characteristic features, that is, a light-absorption effect at the non-current injection portion and guiding of light in a direction quite different from the extending axis direction of the light-emitting portion. Since FP mode oscillation can be efficiently suppressed, the element length can be reduced. For this reason, efficiency of use of a wafer can be improved, and productivity of the element can be improved. Furthermore, if the active layer or the waveguide has an MQW (Multi Quantum Well) structure, a wave length shift at an absorption end upon current injection immediately occurs. Thus, the effect of oblique reflection at the end face is conspicuous.

In this manner, since incoherent light having a large spectrum width can be strongly coupled to a single mode fiber, the superluminescent diode of the present invention can be applied as a light source for a variety of optical measurement equipment.

As an application example, a case will be described below wherein the present invention is applied to a light waveguide obstacle searching apparatus which can search an obstacle point in a small light waveguide structure with high position precision.

Figure 14:
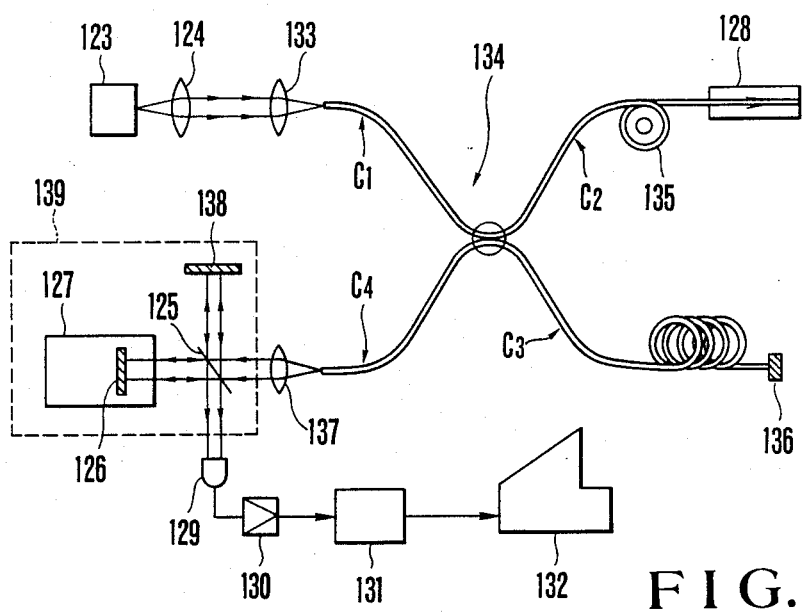
FIG. 14 is a diagram showing an obstacle point searching apparatus for a light waveguide utilizing the superluminescent diode of the present invention as a light source.

FIG. 14 shows the light waveguide obstacle searching apparatus. The principle of this apparatus will now be briefly described. A light source having a large spectrum width is used, and light emitted from the light source is guided to become incident on a light waveguide to be measured. Backward scattered light which is scattered backward at obstacle points scattered in the light waveguide and propagates toward an incident direction is caused to interfere with reference light to provide a delay time or an optical path difference to the backward scattered light and the reference light. An interfered portion with respect to each delay time is measured to detect power of light scattered in the light waveguide, thus obtaining the positions of the obstacle points.

In FIG. 14, reference numeral 133 denotes a focusing lens; 134, a fiber type photocoupler; 135, a cylindrical electrostrictive oscillator; 136, a total reflection mirror; 137, a collimator lens; and 138, a total reflection mirror.

A light-emitting diode 123 is one described in the above embodiments, and light emitted from the diode is collimated to parallel light by a collimatorlens 124. Thereafter, the parallel light is incident on the fiber type photocoupler 134 through the fcusing lens 133. The fiber type photocoupler 134 can distribute light incident from one branch portion $C_1$ in two directions, i.e., toward branch portions $C_2$ and $C_3$. An output end of the branch portion $C_2$ of the photocoupler 134 is arranged to excite a propagation mode of a light waveguide 128 to be measured. Light incident on the branch portion $C_2$ is incident on the light waveguide 128 from the output end of the fiber of the branch portion $C_2$. Backward scattered light generated in this light waveguide is incident again on the fiber of the branch portion $C_2$, and is output from the fiber of a branch portion $C_4$ through the branch portion $C_4$. Light incident from the branch portion $C_1$ and distributed to the branch portion $C_3$ is totally reflected by the total reflection mirror 136 arranged at the fiber output end of the branch portion $C_3$, and propagates toward the branch portion $C_3$ again. This light is mixed with the backward scattered light scattered in the light waveguide 128 and returned through the branch portion $C_2$. The mixed light is output through the branch portion $C_4$, and is collimated to parallel light by the collimator lens 137. Thereafter, the parallel light is split into two directions by a beam splitter 125. The light passing through the beam splitter 125 is reflected by a total reflection mirror 126 and is then reflected by the beam splitter 125. The reflected light is mixed with light which is reflected by the beam splitter 125 and is then reflected by the total reflection mirror 138 to be returned to the beam splitter 125. The mixed light is incident on a photodetector 129.

In FIG. 14, the fiber of the branch portion $C_2$ of the fiber type photocoupler is wound around the cylindrical electrostrictive oscillator 135. The electrostrictive oscillator 135 is AC-driven at a resonance frequency of 20 kHz, and light propagating through the fiber of the branch portion $C_3$ is phase-modulated. Therefore, the backward scattered light propagating through the branch portion $C_2$ is also phase-modulated. When the phase-modulated backward scattered light is caused to interfere with reference light which propagates through the branch portion $C_3$, is reflected by the total reflection mirror 136, and propagates through the branch portion $C_3$ again, the amplitude of an interference intensity is oscillated at 20 kHz. In this embodiment, the 20-kHz component is detected by a selection level meter 131.

Figure 15:
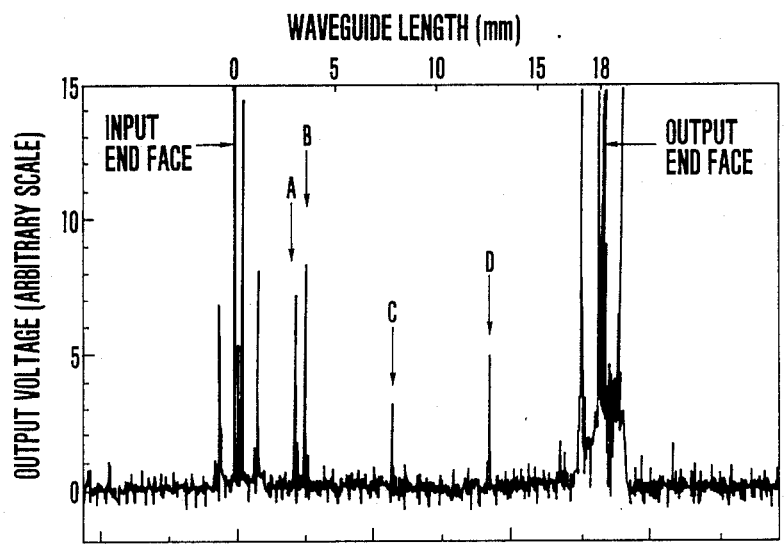
FIG. 15 is a graph showing a result of obstacle point searching of an $SiO_2$ light waveguide by the apparatus shown in FIG. 14.

In the apparatus shown in FIG. 14, when the element shown in FIG. 5 is used as the light-emitting diode 123, incoherent light can be strongly coupled into the fiber. When obstacle points in a 1.8-cm long $SiO_2$ glass waveguide were searched, they could be detected with high position precision, as indicated by A, B, C, and D in FIG. 15.

For further details of the function of this apparatus, refer to Japanese Patent Application No. 62-27346.

What is claimed is:

1. A superluminescent diode comprising:
   a current injection portion having a current injection electrode formed adjacent to a first end face;
   a light-absorption portion contiguous with said current injection portion; and
   a waveguide continuously formed to extend from said current injection portion to said light-absorption portion,
   wherein said waveguide is constituted by an active layer and a member which completely buries said active layer, has a bandgap larger than that of said active layer, and is formed of a material having a small refractive index, said waveguide of said current injection portion is linearly formed to be perpendicular to said first end face, and said waveguide of said light-absorption portion has an end portion for guiding reflected light in a direction different from a propagation direction of light propagating through said waveguide.

2. A superluminescent diode according to claim 1, wherein said waveguide of said light-absorption portion has a structure for guiding light in a direction different from the axis of said current injection portion.

3. A superluminescent diode according to claim 1, wherein said waveguide of said light-absorption portion has a structure in which a sectional area of said active layer is gradually decreased in a direction to separate from one end of said current injection portion.

4. A superluminescent diode according to claim 1, wherein the end portion of said waveguide of said light-absorption portion reaches a second end face.

5. A superluminescent diode according to claim 4, wherein said waveguide of said light-absorption portion is located on an extension of the axis of said current injection portion, and said second end face is inclined with respect to the axis of said current injection portion.

6. A superluminescent diode according to claim 1, wherein the end portion of said waveguide of said light-absorption portion is separated from all the end faces.

7. A suerluminescent diode according to claim 4, wherein said waveguide of said light-absorption portion has a bent portion adjacent to said current injection portion, and a linear portion extending from the bent portion to said second end face.

8. A superluminescent diode according to claim 1, further comprising an anti-reflecting coat formed on said first end face.

* * * * *